United States Patent

Tomikawa et al.

[11] Patent Number: 6,060,771
[45] Date of Patent: May 9, 2000

[54] CONNECTING LEAD FOR SEMICONDUCTOR DEVICES AND METHOD FOR FABRICATING THE LEAD

[75] Inventors: Tadashi Tomikawa; Shogo Hashimoto, both of Itami, Japan

[73] Assignee: Sumitomo Electric Industries, Inc., Osaka, Japan

[21] Appl. No.: 09/259,590

[22] Filed: Mar. 1, 1999

[30] Foreign Application Priority Data

Mar. 9, 1998 [JP] Japan .................................. 10-056313

[51] Int. Cl.⁷ .......................... H01L 23/48; H01L 23/52; H01L 29/40
[52] U.S. Cl. .......................... 257/676; 257/693; 257/775; 257/737; 257/787
[58] Field of Search ...................... 257/676, 693, 257/775, 737, 787

[56] References Cited

U.S. PATENT DOCUMENTS

| | | | |
|---|---|---|---|
| 4,842,662 | 6/1989 | Jacobi | 257/781 |
| 4,977,441 | 12/1990 | Ohtani et al. | 257/737 |
| 5,034,345 | 7/1991 | Shirahata | 438/613 |
| 5,108,950 | 4/1992 | Wakabayashi et al. | 438/613 |
| 5,130,781 | 7/1992 | Kovac et al. | 257/676 |
| 5,132,772 | 7/1992 | Fetty | 257/676 |
| 5,349,238 | 9/1994 | Ohsawa et al. | 257/736 |
| 5,528,078 | 6/1996 | Shin | 257/676 |
| 5,563,445 | 10/1996 | Iijima et al. | 257/698 |
| 5,793,118 | 8/1998 | Nakajima | 257/790 |
| 5,886,399 | 3/1999 | Ohsawa et al. | 257/668 |

FOREIGN PATENT DOCUMENTS

| | | |
|---|---|---|
| 60-206054 | 10/1985 | Japan . |
| 62-199022 | 9/1987 | Japan . |
| 2647499 | 5/1990 | Japan . |
| 3-206633 | 9/1991 | Japan . |
| 4-323837 | 11/1992 | Japan . |

*Primary Examiner*—Mahshid Saadat
*Assistant Examiner*—Jhihan B. Clark
*Attorney, Agent, or Firm*—McDermott, Will & Emery

[57] ABSTRACT

A highly reliable connecting lead for devices that mount semiconductors. The lead is made of copper or copper alloy. The thickness of the oxide film at the interface between the copper or copper alloy lead and an aluminum bump electrode is 10 nm or less. The contents of oxygen and carbon in the aluminum bump electrode are 1 atm % or less each.

4 Claims, 1 Drawing Sheet

CONNECTING LEAD FOR SEMICONDUCTOR DEVICES AND METHOD FOR FABRICATING THE LEAD

BACKGROUND OF THE INVENTION

1. Field of the Invention

The invention relates to an electrode-connecting lead used for semiconductor devices and a method for fabricating the lead.

2. Description of the Background Art

Silicon semiconductors are widely and popularly used as semiconductors. Aluminum pad electrodes are usually used for terminals connecting these semiconductors and external electrodes, because they have good processibility and superior characteristics including low electric resistance, and low-cost producibility.

Various structures were devised to connect the aluminum pad electrode on a silicon semiconductor element to an external terminal. Conventionally, the wire-bonding method is mainly used, in which the aluminum pad electrode is connected to an independent metallic lead terminal, called a lead frame, with a wire of gold or aluminum. As semiconductor elements become highly integrated, the number of electrode increases and the electrode itself is subdivided, causing dense lead terminals. In response to these circumstances, instead of an independent electrode such as a lead frame, a lead of metallic film formed on a polyimide film by etching or other methods is used as a lead to connect directly to the pad electrode on a silicon semiconductor. An example of this means is disclosed in Unexamined Japanese Patent Publication 62-199022, in which a copper bump electrode provided on a metallic lead through a hole in the polyimide film on the lead is connected to the pad electrode formed on a silicon semiconductor element, the bump electrode being plated with gold to prevent the copper part from rusting. In this example, a desirable result is obtained when the pad electrode on the silicon element is made thinner than the insulating passivation film on the element.

Unexamined Japanese Patent Publication 3-206633 discloses a method in which a bump electrode need not be attached to a lead, because the aluminum pad electrode on a silicon element protrudes beyond an insulation film. According to the application, it is desirable that copper or aluminum be used as the lead; it is more desirable that the lead surface be plated with aluminum or the lead surface be plated with nickel before plating with aluminum.

Unexamined Japanese Patent Publication 4-323837 discloses a method in which a copper lead is connected to the pad electrode on a silicon element through an aluminum electrode of a tape carrier package (TCP), avoiding a direct connection of the copper lead to the pad electrode. In other words, the connection between the lead and the element is made possible by using aluminum or aluminum alloy for the inner lead. In this example, an aluminum-plated copper-based lead is adhered to a polyimide film, for instance, and the end portion is processed into the inner lead by etching or other methods.

In order to fulfill high reliability in the connection between the aluminum pad electrode on a silicon element and the lead, various methods were devised as shown above. However, further improvement is needed to reduce the manufacturing cost at the same time.

The fundamental method of the conventional devices is based on the connection between the aluminum pad electrode on a silicon element and the lead, mainly consisting of copper, formed on a polyimide film. When copper is used for the lead, it is difficult to connect the copper lead to the aluminum pad. The reason is that whereas the oxide film on the surface of the aluminum can be broken by the application of ultrasonic waves so that the activated aluminum underneath the oxide film directly contacts the copper for satisfactory connection it is difficult to break the oxide film on the surface of the copper by ultrasonic waves. To circumvent this difficulty, a bump electrode is provided on the copper lead. In a foregoing prior art, the copper bump electrode is plated with gold. In another example cited above, instead of using the bump electrode, the copper lead is plated with aluminum. Thus, one solution is to use aluminum for the lead to be connected with the aluminum pad electrode on a silicon element. However, to secure a more reliable connection, it is necessary to thoroughly examine the aluminum used in the lead and the interface between the aluminum bump electrode and copper lead.

SUMMARY OF THE INVENTION

The invention, meticulously contriving the constitution of the foregoing connection, offers conditions that enable a highly reliable connection. One condition is that a copper or copper alloy lead be provided with an aluminum bump electrode at the place of connection with a semiconductor. Another condition is that the thickness of the oxide film on the lead at the interface with the aluminum num bump electrode be 10 nm or less. Yet another condition is that the contents of oxygen and carbon in the aluminum that constitutes the aluminum bump electrode be 1 atm % or less each, where atm % means the ratio of the number of atoms.

In addition, an effective connection is attainable when the aluminum that constitutes the aluminum bump electrode satisfies the following formula:

$$0.1 \leq Y/(X \times R) \leq 10,$$

where Y: knoop hardness (kgf/mm$^2$),

X: (111) orientation ratio (%),

R: average grain size ($\mu$m).

In other words, the aluminum bump electrode requires the specified aluminum as in the above formula, as opposed to aluminum in general, to ensure a more reliable connection. To realize this object, it is desirable that the foregoing Y satisfy a formula $20 \leq Y \leq 70$, the foregoing X a formula $60 \leq X$, and the R a formula $0.1 \leq R$. It is also desirable that the aluminum thickness of the bump electrode lie in the range of 1 $\mu$m to 20 $\mu$m inclusive.

A fabricating method for the connecting terminal is as follows: In forming an aluminum electrode on a copper or copper alloy lead, the oxide film on the lead surface is first removed in a vacuum, and the aluminum film is formed without breaking the vacuum. The aluminum film is formed by controlling the vacuum condition and the deposition rate of the film in such a manner that the number of particles of the incident background gas per unit time and per unit area of the film deposition is 1/100 or less that of the incident aluminum particles of the same conditions.

The invention offers a highly reliable connecting terminal for devices that mount silicon semiconductors. More specifically, the connecting terminal prevents short-circuits across terminals, and provides strong and durable bonding between the bump electrode of the connecting terminal and a pad electrode on the semiconductor element and between the bump electrode and the lead of the connecting terminal.

DETAILED DESCRIPTION OF THE INVENTION

Figure 1:
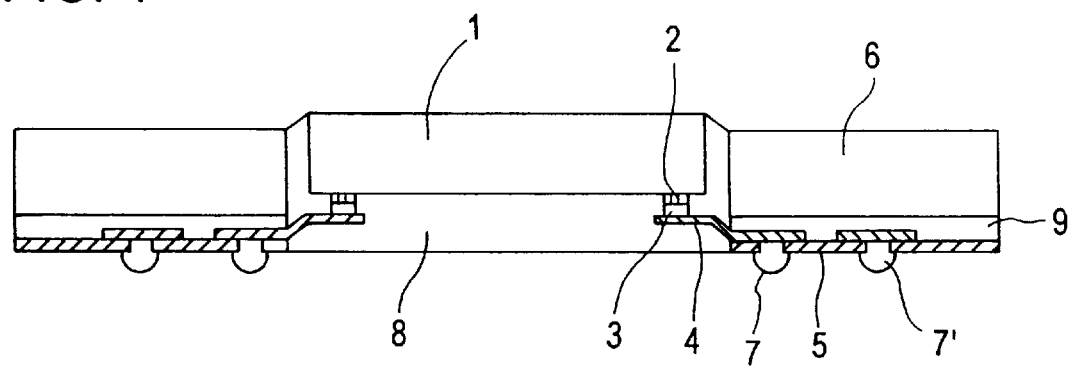
FIG. 1 is a sectional view showing the wiring structure of a semiconductor device that employs an example of the connecting lead of the invention.

FIG. 1 is a sectional view showing the wiring structure of a semiconductor device that employs an example of the connecting lead of the invention. A semiconductor element 1 has on the peripheral area thereof aluminum pad electrodes 2, to which leads of the invention are to be connected. The lead frames comprise an aluminum bump electrode 3, a copper or copper-alloy lead 4, and a polyimide tape 5, which has via holes for bump electrodes. The lead frames, fixed to the frame 6 of a reinforcing material with an adhesive 9, have a bump electrode 7 made of solder, gold, or other metals to which outer electrodes are connected. Another bump electrode 7' is connected to another pad electrode through another lead 4', although this connection is not depicted in FIG. 1. After the semiconductor element 1 and the lead frames are connected through the aluminum pad electrodes 2 and the aluminum bump electrodes 3, the unit 1 and the frame 6 of the reinforcing material are consolidated with an encapsulant 8.

Figure 2:
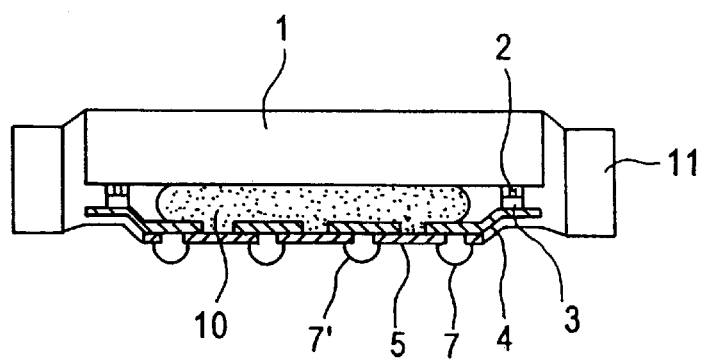
FIG. 2 is a sectional view showing the wiring structure of a semiconductor device that employs another example of the connecting lead of the invention.

FIG. 2 is a sectional view showing the wiring structure of a semiconductor device that employs another example of the connecting lead of the invention. Whereas a semiconductor element 1, aluminum pad electrodes 2, aluminum bump electrodes 3, copper or copper-alloy leads 4, and polyimide tapes 5 are the same as those in FIG. 1, bump electrodes 7 and 7' made of solder, gold, or other metals to which outer electrodes are connected are placed inside the aluminum pad electrodes 2 on the semiconductor element 1. Elastomer 10 is filled in the interstice between the lead frame and the semiconductor element 1, which are then consolidated with a protective frame 11 and an encapsulant 8. The semiconductor element 1 and the lead frame are connected through the connection between the aluminum pad electrode 2 and the aluminum bump electrode 3.

As described in the section "Description of the Background Art," various means are devised for the connection between a semiconductor element and external electrodes. Of these means, a means of connection with the aluminum pad electrode on a standard semiconductor element is the object of the invention.

Aluminum, although ideal as an electrode material for connection with an aluminum pad electrode in terms of the connection between the same kinds of metal, has difficulties in plating, etching, and soldering to be used as a lead material due to the characteristics thereof. On the other hand, copper or copper alloy is considered most suitable as the lead material by virtue of its high electrical conductivity.

However, the bonding strength between aluminum and copper depends largely on interfacial conditions. Particularly, the oxide film remaining on the surface of copper counteracts the bonding between the two materials. Sputtering with an inert gas under a highly reduced pressure or vacuum condition is effective to remove the oxide film. In the invention, sputtering of the copper surface with an argon gas was successfully carried out. Subsequently, without breaking the reduced pressure or vacuum condition, aluminum was evaporated onto the copper surface to provide an aluminum bump electrode with a minimized oxide film on the copper. It is essential that the aluminum vacuum evaporation be successively executed without breaking the reduced pressure or vacuum condition to suppress the copper-oxide film to 10 nm or below; otherwise the activated copper surface begins to form an oxide film immediately. The thickness of the copper-oxide film is measured by a transmission electron microscope (TEM) on the section of the interface between the copper and aluminum.

As for the aluminum used for the bump electrode, increase of impurities, especially oxygen and carbon, in the aluminum decreases the bonding strength between the copper lead and aluminum bump electrode. In order to enhance the reliability of the connection between the two materials, it is necessary to reduce the foregoing impurities. More specifically, it is desirable that the oxygen and carbon contents in the aluminum be 1 atm % or less each. Impurities are measured by Auger electron spectroscopy (AES), energy-dispersive method in X-ray spectroscopy (EDX), or secondary-ion mass spectrometry (SIMS).

The aluminum bump electrode must also be bonded to an aluminum pad electrode with sufficient strength. This strength is dependent on the crystallinity and crystal orientation of the aluminum in the bump electrode. Experimental results established the following condition:

$$0.1 \leq Y/(X \times R) \leq 10,$$

where Y: knoop hardness (kgf/mm$^2$),

X: (111) orientation ratio (%),

R: average grain size ($\mu$m).

This formula gives the optimum condition of the aluminum bump electrode to be connected with the aluminum pad electrode by ultrasonic bonding. As is seen in the formula, the condition is governed by knoop hardness, orientation ratio, and average grain size.

An excessively hard aluminum bump electrode reduces the bonding strength with the aluminum pad electrode and damages semiconductor elements via the aluminum pad electrode. Hence, it is desirable that the knoop hardness be 70 kgf/mm$^2$ or less, preferably 60 kgf/mm$^2$ or less.

The orientation ratio is used to evaluate the close-packed structure of the aluminum. The closeness of packing determines the oxidation stability of the surface of the completed bump electrode. If closely packed, the bump electrode is resistive to oxidation and gives a favorable result in the succeeding process of ultrasonic bonding with the aluminum pad electrode. If loosely packed, the bump electrode cannot provide sufficient bonding with the aluminum pad electrodes.

The (111) orientation ratio is calculated by the following formula using the measured results of the X-ray diffraction-peak intensity "I" on (111), (200), (220), and (311) surfaces:

$$X = I_{(111)}/I_{(111)} + I_{(200)} + I_{(220)} + I_{(311)} \times 100 (\%),$$

where $I_{(111)}$ means the diffraction-peak intensity on the (111) surface, and the same is applied to $I_{(200)}$, $I_{(220)}$, and $I_{(311)}$. It is desirable that the (111) orientation be 60% or more, preferably 70% or more.

The average grain size, obtained by electron microscopy, has an influence upon the breaking of the oxide film at the time of bonding. An excessively small grain size has a tendency to decrease the percentage of the newly exposed aluminum surface due to the breaking of the oxide film on the surface by the application of ultrasonic waves, reducing the bonding strength. It is desirable that the average grain size be 0.1 μm or more.

The smaller the value of Y/(X×R) in the first formula, which is the combination of the foregoing physical properties, the greater the bonding strength. However, an excessively small value requires efficiency reduction for producing corresponding physical properties. Accordingly, a minimum value of 0.1 is selected. If the value exceeds 10, the bonding strength decreases to an unacceptable level.

It is desirable that the thickness of the aluminum bump electrode lie in the range of 1 μm to 20 μm inclusive. If thinner than 1 μm, the applied pressure for bonding the aluminum bump electrode with the aluminum pad electrodes damages the semiconductor element. If thicker than 20 μm, the volume of the pressed-out aluminum at the time of bonding increases to the extent that it may short-circuit across leads. To further suppress the volume of the pressed-out aluminum, it is preferable that the aluminum thickness be limited to a maximum of 5 μm.

In order to produce the aluminum bump electrode under the abovementioned conditions, after the sputtering process that removes the oxide film on the copper or copper alloy lead, aluminum vacuum condition evaporation is carried out without breaking the reduced pressure or vacuum condition. As for the sputtering conditions, it is desirable that a negative bias voltage of hundreds to thousands of volts be applied to the copper lead. To expedite degasification including moisture removal, it is preferable that the base material including the copper lead be heated at 100 to 300° C. If the applied voltage is excessively low, considerable time is necessary to remove the oxide film; if excessively high, materials around the base material including the copper lead incur increased damage. If the copper temperature is excessively low, degasification consumes considerable time; if excessively high, organic or low-melting point materials around the base material including copper incur increased damage.

In the subsequent aluminum-film formation, to avoid the inclusion of impurities, it is desirable that the aluminum film be formed after thorough degasification of the copper or copper alloy lead, the neighboring semiconductor device's components, and the aluminum film-forming tool. As for the aluminum film-forming condition, the number of particles of the incident background gas to the aluminum film-forming surface per unit time and unit area should be 1/100 or less that of the incident aluminum particles of the same conditions. This condition can be fufilled by controlling the vacuum degree in the background and the deposition rate of the film. Thus, the oxygen and carbon contents in the aluminum can be decreased to 1 atm % or less each.

The aluminum thickness can be controlled by adjusting the film-deposition time in accordance with the film-deposition rate.

As mentioned above, the invention offers a more reliable connecting lead than conventional lead.

EXAMPLE 1

Copper films were formed on 0.125-mm-thick polyimide films by electroless plating and electroplating, and copper leads, 0.1 mm wide and 0.05 mm thick, were produced by etching. To provide an aluminum bump electrode on the copper lead, the copper lead was placed in a vacuum chamber. The oxide film on the copper surface was removed by sputtering argon gas onto the lead area under a vacuum condition higher than 0.01 torr. The sputtering was performed at about 150° C. for 30 minutes with a negative bias of 800 V applied onto the copper lead.

With the same vacuum condition maintained, after the masking of the copper lead, aluminum vacuum evaporation was carried out by electron-beam evaporation at a film-deposition rate of 0.1 μm/min under a background vacuum condition higher than $1 \times 10^{-6}$ torr. Under these conditions, the ratios of the number of the background oxygen and carbon particles to the number of aluminum particles incident to the aluminum film-forming surface were less than 0.008 and less than 0.004, respectively. An aluminum film having a thickness of 5 μm was formed by vacuum evaporation under these conditions, which are summarized in Table 1.

TABLE 1

| | | | Sputtering conditions | | | | Al evaporation conditions | | | |
|---|---|---|---|---|---|---|---|---|---|---|---|
| | No. | Material of Cu terminal | Pressure (torr) | Bias voltage (V) | Temperature (° C.) | Duration (Min) | Intended thickness (μm) | Pressure (torr) | Evaporation speed (μm/min) | Ratio of oxygen | Ratio of carbon |
| Example | 1 | Plated Cu | <0.01 | −800 | 150 | 30 | 5 | $<1 \times 10^{-6}$ | 0.1 | <0.008 | <0.004 |
| | 2 | Cu alloy | <0.01 | −600 | 180 | 40 | 5 | $<1 \times 10^{-6}$ | 0.2 | <0.004 | <0.002 |
| | 3 | Plated Cu | <0.01 | −800 | 150 | 15 | 5 | $<1 \times 10^{-6}$ | 0.1 | <0.008 | <0.004 |
| | 4 | Plated Cu | <0.01 | −800 | 150 | 30 | 5 | $<1 \times 10^{-6}$ | 0.2 | <0.004 | <0.002 |
| | 5 | Plated Cu | <0.01 | −800 | 150 | 30 | 10 | $<1 \times 10^{-6}$ | 0.4 | <0.002 | <0.001 |
| | 6 | Plated Cu | <0.01 | −800 | 150 | 30 | 10 | $<1 \times 10^{-6}$ | 0.8 | <0.001 | <0.0005 |
| | 7 | Plated Cu | <0.01 | −800 | 150 | 30 | 10 | $<1 \times 10^{-6}$ | 1.0 | <0.0008 | <0.0004 |
| | 8 | Plated Cu | <0.01 | −800 | 150 | 30 | 10 | $1 \times 10^{-5}$ | 1.0 | <0.008 | <0.004 |
| | 9 | Plated Cu | <0.01 | −800 | 150 | 30 | 20 | $2 \times 10^{-5}$ | 2.0 | <0.008 | <0.004 |
| | 10 | Plated Cu | <0.01 | −800 | 150 | 30 | 10 | $1 \times 10^{-5}$ | 0.8 | 0.01 | <0.005 |
| | 11 | Plated Cu | <0.01 | −800 | 150 | 30 | 15 | $1 \times 10^{-6}$ | 2.0 | <0.004 | <0.0002 |
| | 12 | Plated Cu | <0.01 | −800 | 150 | 30 | 5 | $1 \times 10^{-5}$ | 0.8 | 0.01 | <0.004 |
| | 13 | Plated Cu | <0.01 | −800 | 150 | 30 | 3 | $1 \times 10^{-6}$ | 0.1 | <0.008 | <0.004 |
| | 14 | Plated Cu | <0.01 | −800 | 150 | 30 | 3 | $1 \times 10^{-6}$ | 0.08 | 0.01 | <0.004 |
| | 15 | Plated Cu | <0.01 | −800 | 150 | 30 | 5 | $1 \times 10^{-5}$ | 0.8 | 0.01 | 0.01 |
| | 16 | Plated Cu | <0.01 | −800 | 150 | 30 | 10 | $5 \times 10^{-5}$ | 4.0 | 0.01 | <0.004 |
| | 17 | Plated Cu | <0.01 | −800 | 150 | 30 | 10 | $5 \times 10^{-5}$ | 5.0 | <0.008 | <0.004 |
| Comparison example | 18 | Plated Cu | <0.01 | −800 | 150 | 5 | 5 | $<1 \times 10^{-6}$ | 0.1 | <0.008 | <0.004 |
| | 19 | Plated Cu | <0.01 | −800 | 150 | 30 | 5 | $1 \times 10^{-5}$ | 0.4 | 0.02 | <0.001 |
| | 20 | Plated Cu | <0.01 | −800 | 150 | 30 | 5 | $1 \times 10^{-5}$ | 0.2 | <0.004 | 0.02 |
| | 21 | Plated Cu | <0.01 | −800 | 150 | 30 | 5 | $1 \times 10^{-4}$ | 1.0 | 0.08 | 0.01 |
| | 22 | Plated Cu | <0.01 | −800 | 150 | 30 | 5 | $5 \times 10^{-4}$ | 10.0 | 0.12 | 0.04 |

The completed lead was bonded to the aluminum pad electrode on a silicon semiconductor chip by ultrasonic bonding with a load of 80 g, an ultrasonic power of 0.5 kW, and an applying period of 0.5 sec (the same bonding conditions were applied to the examples and comparison examples described hereinafter). The bonding strength was measured by pull strength. The test results are shown in Table 2.

EXAMPLES 3 TO 17 AND COMPARISON EXAMPLES 18 TO 22

Connecting leads were fabricated with a procedure similar to Example 1 except for different sputtering and aluminum-vacuum-evaporation conditions as shown in Table 1. To obtain different physical properties of evaporated aluminum, oxygen and carbon were intentionally included as impurities into the aluminum of some examples and comparison

TABLE 2

| | No. | Thickness of Cu oxide film (nm) | Oxygen content in Al (atm %) | Carbon content in Al (atm %) | (111) Orientation ratio of Al (X) (%) | Knoop hardness of Al (Y) (kgf/mm²) | Grain size of Al (R) (μm) | F = Y/(X·R) | Pull strength (kgf/mm²) | Evaluation | Breakdown mode |
|---|---|---|---|---|---|---|---|---|---|---|---|
| Example | 1 | <3 | <0.1 | <0.1 | 90 | 37 | 0.2 | 2.1 | 5.0 | ○ | Severance at Cu lead |
| | 2 | <3 | <0.1 | <0.1 | 88 | 42 | 0.1 | 4.8 | 5.2 | ○ | Separation at Al/Al interface |
| | 3 | 10 | <0.1 | <0.1 | 94 | 44 | 0.2 | 2.3 | 4.2 | ○ | Severance at Cu lead |
| | 4 | <3 | <0.1 | <0.1 | 57 | 51 | 0.1 | 8.9 | 2.5 | ○ | Separation at Al/Al interface |
| | 5 | <3 | <0.1 | <0.1 | 72 | 50 | 0.2 | 3.5 | 4.1 | ○ | Severance at Cu lead |
| | 6 | <3 | <0.1 | <0.1 | 81 | 18 | 0.1 | 2.2 | 3.8 | ○ | Severance at Cu lead |
| | 7 | <3 | <0.1 | <0.1 | 95 | 51 | 0.2 | 2.7 | 5.4 | ○ | Severance at Cu lead |
| | 8 | <3 | <0.1 | <0.1 | 83 | 32 | 0.2 | 1.9 | 5.2 | ○ | Severance at Cu lead |
| | 9 | <3 | <0.1 | <0.1 | 78 | 62 | 0.08 | 9.9 | 3.5 | ○ | Severance at Cu lead |
| | 10 | <3 | 1 | <0.1 | 88 | 83 | 0.1 | 9.4 | 2.8 | ○ | Separation at Al/Al interface |
| | 11 | <3 | <0.1 | <0.1 | 90 | 42 | 0.5 | 0.9 | 5.6 | ○ | Severance at Cu lead |
| | 12 | <3 | 1 | 1 | 87 | 42 | 0.1 | 4.8 | 4.8 | ○ | Severance at Cu lead |
| | 13 | <3 | <0.1 | <0.1 | 51 | 58 | 0.1 | 11.4 | 1.8 | □ | Separation at Al/Al interface |
| | 14 | <3 | 1 | <0.1 | 84 | 92 | 0.1 | 11.0 | 1.8 | □ | Separation at Al/Al interface |
| | 15 | <3 | 1 | 1 | 75 | 102 | 0.1 | 14.3 | 1.5 | □ | Separation at Al/Al interface |
| | 16 | <3 | 1 | <0.1 | 74 | 84 | 0.01 | 113.5 | 1.0 | □ | Separation at Al/Al interface |
| | 17 | <3 | <0.1 | <0.1 | 81 | 61 | 0.05 | 15.1 | 1.7 | □ | Separation at Al/Al interface |
| Comparison example | 18 | 20 | <0.1 | <0.1 | 82 | 41 | 0.2 | 2.5 | 0.8 | X | Separation at Cu/Al interface |
| | 19 | <3 | 2 | <0.1 | 77 | 81 | 0.1 | 10.5 | 1.1 | X | Separation at Cu/Al interface |
| | 20 | <3 | <0.1 | 2 | 75 | 75 | 0.1 | 10.0 | 0.9 | X | Separation at Cu/Al interface |
| | 21 | <3 | 8 | 1 | 71 | 92 | 0.02 | 64.8 | 0.7 | X | Separation at Cu/Al interface |
| | 22 | <3 | 12 | 4 | 62 | 112 | 0.01 | 180.6 | 0.5 | X | Separation at Cu/Al interface |

○: Excellent (The pull strength was 2.0 kgf/mm² or more.)
□: Acceptable
X: Unsatisfactory (Separation occurred at the Cu/Al interface.)

EXAMPLE 2

Pieces of copper-alloy foil (brand name of Kobe Steel, Ltd.: KLF-5) were adhered to 0.100-mm-thick polyimide films to produce connecting leads, 0.1 mm wide and 0.1 mm thick, by etching. The lead was placed in a vacuum chamber as in Example 1. The oxide film on the copper surface was removed by sputtering argon gas onto the lead area under a vacuum condition higher than 0.01 torr. The sputtering was performed at 180° C. for 40 minutes with a negative bias of 600 V applied onto the copper lead.

Subsequently, under a higher vacuum condition than $1\times10^{-6}$ torr, masking was applied to the lead, and aluminum vacuum evaporation was carried out at a film-deposition rate of 0.2 μm/min. Under these conditions, the number of background oxygen and carbon particles correspond to less than 0.4 atm % and less than 0.2 atm %, respectively. An aluminum film having a thickness of 5 μm was formed by vacuum evaporation under these conditions, which are also summarized in Table 1 along with Example 1.

As with Example 1, the completed lead was bonded to the aluminum pad electrode on a silicon semiconductor chip by ultrasonic bonding, and the bonding strength was measured by pull strength. The test results are shown in Table 2 along with Example 1.

examples. The test results for the completed connecting leads are shown in Table 2.

The column labeled "Evaluation" in Table 2, judges the separation at the copper/aluminum interface to be unsatisfactory and is marked with "X", and the others are judged to be "□" or "○". The mark "○" represents the result in which the pull strength is 2.0 kgf/m² or more. It is desirable that the condition yielding the mark "○" be employed.

What is claimed is:

1. A connecting lead for connecting semiconductor elements, the connecting lead comprising a copper or copper alloy lead and an aluminum bump electrode, wherein:

the thickness of an oxide film at the interface between the copper or copper alloy lead and the aluminum bump electrode is 10 nm or less; and the contents of oxygen and carbon in the aluminum that constitutes the aluminum bump electrode is 1 atm % or less each.

2. The connecting lead for semiconductor devices as defined in claim 1, wherein:

the aluminum that constitutes the aluminum bump electrode satisfies the following formula:

$$0.1 \leq Y/(X \times R) \leq 10,$$

where Y: knoop hardness (kgf/mm²),

X: (111) orientation ratio (%),
R: average grain size (μm).

3. The connecting lead for semiconductor devices as defined in claim 2, wherein the Y satisfies a formula $20 \leq Y \leq 70$, the X a formula $60 \leq X$, and the R a formula $0.1 \leq R$.

4. The connecting lead for semiconductor devices as defined in claim 2, wherein the thickness of the aluminum lies in the range of 1 μm to 20 μm inclusive.

* * * * *

UNITED STATES PATENT AND TRADEMARK OFFICE
CERTIFICATE OF CORRECTION

PATENT NO. : 6,060,771
DATED : May 09, 2000
INVENTOR(S) : Tadashi TOMIKAWA, et al.

It is certified that error appears in the above-identified patent and that said Letter Patent is hereby corrected as shown below:

On the Title page

Section [73], change "Inc." to -- Ltd.--.

Signed and Sealed this

Twenty-fourth Day of April, 2001

Attest:

NICHOLAS P. GODICI

Attesting Officer

Acting Director of the United States Patent and Trademark Office